United States Patent
Eckhardt et al.

(10) Patent No.: US 7,242,711 B2
(45) Date of Patent: Jul. 10, 2007

(54) DECISION FEEDBACK EQUALIZER HAVING REDUCED GATE COUNT

(75) Inventors: Uwe Eckhardt, Dresden (DE); Michael Schmidt, Dresden (DE); Eric Sachse, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 784 days.

(21) Appl. No.: 10/464,987

(22) Filed: Jun. 19, 2003

(65) Prior Publication Data

US 2004/0086036 A1    May 6, 2004

(30) Foreign Application Priority Data

Oct. 31, 2002  (DE) ................................ 102 50 890

(51) Int. Cl.
*H03H 7/40*  (2006.01)
(52) U.S. Cl. ...................... 375/232; 375/233; 375/350; 708/323
(58) Field of Classification Search ................ 375/229, 375/230, 231, 232, 233, 350; 708/300, 322, 708/323
See application file for complete search history.

(56) References Cited

U.S. PATENT DOCUMENTS 5,781,463 A * 7/1998 Ogawa et al. ............... 708/322
6,233,273 B1   5/2001 Webster et al.
6,483,872 B2 * 11/2002 Nguyen ...................... 375/231
6,690,715 B2   2/2004 Webster et al.
6,807,229 B1 * 10/2004 Kim et al. ................... 375/233
7,027,503 B2 *  4/2006 Smee et al. .................. 375/233

FOREIGN PATENT DOCUMENTS

EP        756404      1/1997
EP        887796     12/1998

* cited by examiner

*Primary Examiner*—Dac V. Ha
(74) *Attorney, Agent, or Firm*—Meyertons Hood Kivlin Kowert & Goetzel, P.C.; B. Noël Kivlin (57) ABSTRACT

An improved decision feedback equalization technique is provided that may be used in data communications receivers such as those in WLAN (Wireless Local Area Network) systems. The decision feedback equalizer comprises a feedforward filter that is connected to receive an input data signal and output a filter representation thereof. The feedforward filter has a filter characteristic that depends on filter coefficient data. The decision feedback equalizer further comprises a filter coefficient computation unit for generating the filter coefficient data and outputting the generated data to the feedforward filter. At least one data processing circuit is provided that receives a mode switch signal for switching its operational mode. The data processing circuit is arranged for performing a feedforward filter function in one operational mode and a filter coefficient computation function in another operational mode.

40 Claims, 5 Drawing Sheets

DECISION FEEDBACK EQUALIZER HAVING REDUCED GATE COUNT

BACKGROUND OF THE INVENTION

1. Field of the Invention

The invention generally relates to data communication systems such as WLAN (Wireless Local Area Network) systems, and in particular to decision feedback equalizers that may be operated in receivers in such systems.

2. Description of the Related Art

A wireless local area network is a flexible data communications system implemented as an extension to or as an alternative for, a wired LAN. Using radio frequency or infrared technology, WLAN systems transmit and receive data over the air, minimizing the need for wired connections. Thus, WLAN systems combine data connectivity with user mobility.

Today, most WLAN systems use spread spectrum technology, a wide-band radio frequency technique developed for use in reliable and secure communication systems. The spread spectrum technology is designed to trade-off bandwidth efficiency for reliability, integrity and security. Two types of spread spectrum radio systems are frequently used: frequency hopping and direct sequence systems.

The standard defining and governing wireless local area networks that operate in the 2.4 GHz spectrum, is the IEEE 802.11 standard. To allow higher data rate transmissions, the standard was extended to 802.11b that allows data rates of 5.5 and 11 Mbps in the 2.4 GHz spectrum. This extension is backwards compatible.

Receivers in WLAN systems or other data communication systems usually apply some nonlinear equalization technique to reduce the effects of intersymbol interference and to compensate for the frequency response of the channel. One commonly applied technique is the use of a decision feedback equalizer (DFE) which is an adaptive filter that uses data decisions to adjust its taps to correct for frequency response impairment.

Figure 1:
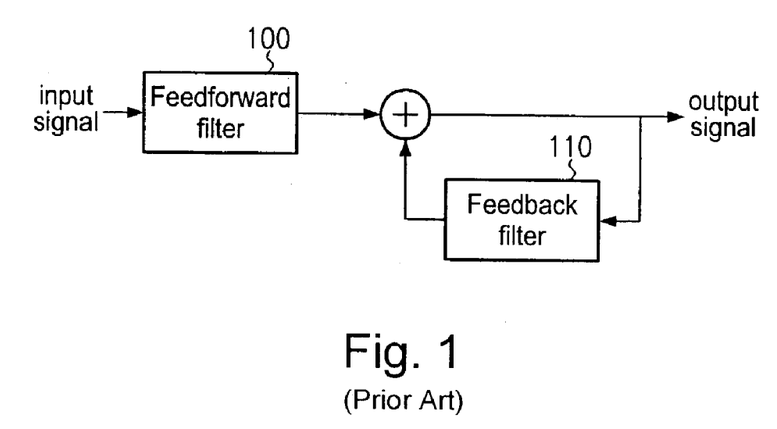
FIG. 1 is a schematic block diagram illustrating the components of a conventional decision feedback equalizer.

An example of a decision feedback equalizer is shown in FIG. 1. The depicted decision feedback equalizer consists of two filters, a feedforward filter 100 and a feedback filter 110. The input to the feedforward filter 100 is the received signal sequence of the receiver. The feedback filter 110 feeds the output data back so that the output data can be combined with the output sequence of the feedforward filter 100. There may be additionally a decision unit (not shown) that receives the output data and that is connected to the feedback filter 110 so that the feedback filter 110 actually receives its input from that decision unit.

While decision feedback filters in data communication receivers have been shown to effectively improve the signal quality and thus the overall system performance, conventionally technologies disadvantageously require complex and highly involved circuitry to perform their functions. For instance, high precision fixed point multiplications need to be performed, and the decision feedback equalizers require a large amount of multipliers and other arithmetic modules for this purpose. This leads not only to high development and manufacturing costs but also increases the chip area needed to implement such functions. Thus, the conventional techniques are disadvantageous by preventing the circuits from being scaled down in size and power consumption.

SUMMARY OF THE INVENTION

An improved decision feedback equalization technique is provided that may reduce the chip area without deteriorating the system performance.

In one embodiment, a data communications receiver is provided that has a decision feedback equalizer. The decision feedback equalizer comprises a feedforward filter that is connected to receive an input data signal and output a filtered representation thereof. The feedforward filter has a filter characteristic that depends on filter coefficient data. The decision feedback equalizer further comprises a filter coefficient computation unit for generating the filter coefficient data and outputting the generated data to the feedforward filter. The decision feedback equalizer further comprises at least one data processing circuit that is operable in at least two operational modes and that is connected to receive a mode switch signal for switching the operational mode. The data processing circuit is arranged for performing a feedforward filter function of the feedforward filter in one of the at least two operational modes, and a filter coefficient computation function of the filter coefficient computation unit in another one of the at least two operational modes.

In another embodiment, there may be provided a WLAN receiver that has a decision feedback equalizer. The decision feedback equalizer comprises a feedforward filter that is connected to receive an input data signal and output a filtered representation thereof. The feedforward filter has a filter characteristic that depends on filter coefficient data. The decision feedback equalizer further comprises a filter coefficient computation unit for generating the filter coefficient data and outputting the generated data to the feedforward filter. The decision feedback equalizer further comprises at least one data processing circuit that is operable in at least two operational modes and that is connected to receive a mode switch signal for switching the operational mode. The data processing circuit is arranged for performing a feedforward filter function of the feedforward filter in one of the at least two operational modes, and a filter coefficient computation function of the filter coefficient computation unit in another one of the at least two operational modes.

In a further embodiment, an integrated circuit chip is provided that has decision feedback equalization circuitry. The decision feedback equalization circuitry comprises a feedforward filter circuit that is connected to receive an input data signal and output a filtered representation thereof. The feedforward filter circuit has a filter characteristic depending on filter coefficient data. The decision feedback equalization circuitry further comprises a filter coefficient computation circuit for generating the filter coefficient data and outputting the generated data to the feedforward filter circuit. The decision feedback equalization circuitry further comprises at least one data processing circuit that is operable in at least two operational modes and that is connected to receive a mode switch signal for switching the operational mode. The data processing circuit is arranged for performing a feedforward filter function of the feedforward filter circuit in one of the at least two operational modes, and a filter coefficient computation function of the filter coefficient computation circuit in another one of the at least two operational modes.

In still a further embodiment, a method of operating a decision feedback equalizer in a data communications receiver is provided. The method comprises generating filter coefficient data, receiving an input data signal, filtering the input data signal in a feedforward filter of the decision feedback equalizer using the filter coefficient data, and outputting a filtered representation of the input data signal. The generation of the filter coefficient data comprises receiving a mode switch signal for switching an operational mode of at least one data processing circuit of the decision feedback equalizer to a filter coefficient computation mode and operating the data processing circuit to perform a filter coefficient computation function. Filtering the input data signal comprises receiving a mode switch signal for switching the operational mode of the data processing circuit to a feedforward filter mode and operating the data processing circuit to perform a feedforward filter function.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention, as illustrated in the accompanying drawings, wherein.

DETAILED DESCRIPTION OF THE INVENTION

The illustrative embodiments of the present invention will be described with reference to the figure drawings.

Figure 2:
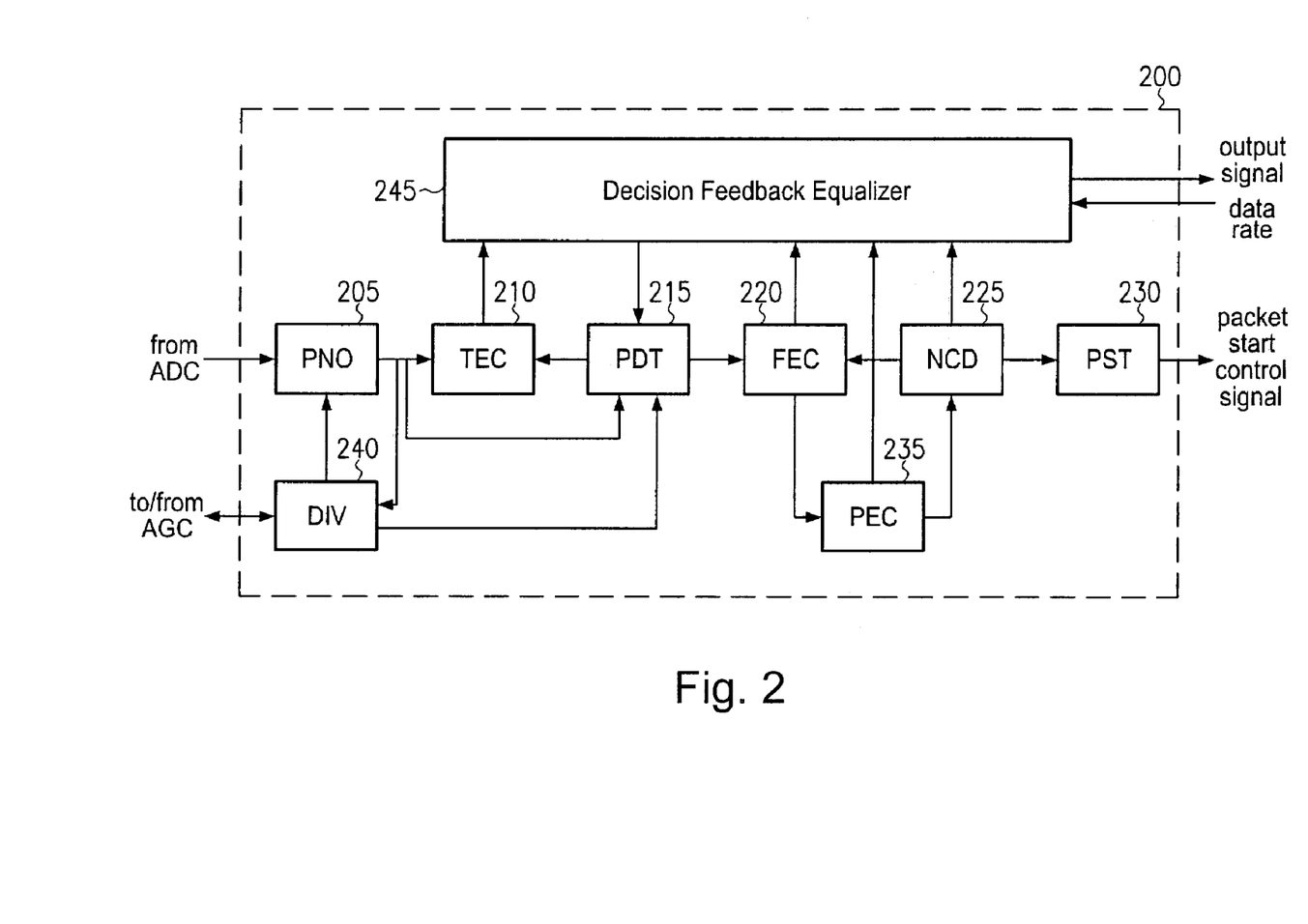
FIG. 2 illustrates the components of a baseband processor of the WLAN receiver according to an embodiment.

Referring now to the drawings and in particular to FIG. 2 which illustrates the components of a WLAN receiver according to an embodiment, the receiver comprises a synchronization baseband part 200 that is connected to a radio frequency part. The radio frequency part may be an analog circuit that receives an analog signal and provides a digitized representation thereof to the baseband part 200. Moreover, the radio frequency part may perform an automatic gain control to control the amplification gain dependent on the received signal power or strength. The automatic gain controller is located in the analog radio frequency part and interchanges control signals with the digital circuitry of the baseband part 200.

The baseband part 200 of the WLAN receiver according to the embodiment shown in FIG. 2 comprises a number of units that are interconnected to form a data path. That is, the baseband part 200 receives the digitized input signal from the radio frequency part and generates output data that is to be demodulated, decoded and descrambled for further processing.

When receiving the digitized input signal in the baseband part 200, a power normalization is performed in a power normalization (PNO) unit 205. The power normalization may be performed under control of a diversity selection (DIV) unit 240 that controls the antenna diversity and which is connected to an automatic gain controller of the radio frequency part. For performing the diversity selection, the diversity selection unit 240 receives the normalized signal from the power normalization unit 205.

The diversity selection unit 240 may further provide a control signal to a preamble detection (PDT) unit 215. The preamble detection unit 215 receives the normalized signal from the power normalization unit 205 and detects a preamble in this signal. A preamble is a special signal pattern used for synchronization acquisition.

As may be seen from FIG. 2, the preamble detection unit 215 provides output signals to a timing error correction (TEC) unit 210 and a frequency error correction (FEC) unit 220. These units are used to detect and correct timing errors and frequency errors, respectively.

Further, there is provided a packet start detection (PSD) unit 230 that detects the start of frame delimiter (SFD) portion in the received data signal to generate a packet start control signal. For this purpose, the packet start detection unit 230 receives input from a non-coherent detection unit 225.

In addition, a decision feedback equalizer 245 is provided that receives the output signal of the timing error correction unit 210 and filters this signal. The decision feedback equalizer 245 may operate dependent on certain input signals that are received from the frequency error correction unit 220, the phase error correction unit 235 and/or the non-coherent detection (NCD) unit 225. Moreover, the decision feedback equalizer 245 may receive a signal which is indicative of the data rate.

Figure 3:
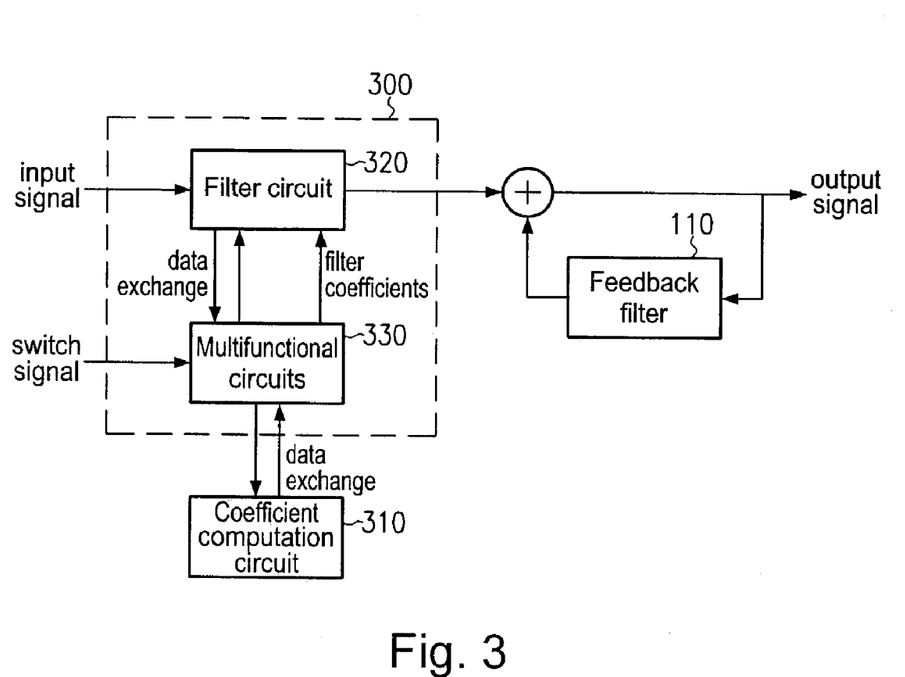
FIG. 3 illustrates a first embodiment of a decision feedback equalizer.

An embodiment of a decision feedback equalizer 245 that may be used in the arrangement of FIG. 2 is shown in FIG. 3. As apparent therefrom, the feedforward filter part comprises a filter circuit 320, a filter coefficient computation circuit 310, and multifunctional circuits 330. The filter circuit 320 receives the input signal that is to be filtered, and outputs the filtered signal so that it can be combined with the output of the feedback filter 110.

As shown in FIG. 3, the multifunctional circuits 330 exchange data with both the filter circuit 320 and the filter coefficient computation circuit 310. As will be discussed in more detail below, the multifunctional circuits 330 are data processing circuits that can be operated in two (or more) operational modes, dependent on a mode switch signal that is supplied to the circuits 330. In one of the operational modes, the data processing circuits 330 perform a feedforward filter function while in another mode, the same circuits perform a filter coefficient computation function.

That is, the actual feedforward filtering is performed by a feedforward filter unit 300 that comprises the filter circuit 320 and the multifunctional circuits 330 when operating in the feedforward filtering mode. When operating in the filter coefficient computation mode, the multifunctional circuits 330, together with the filter coefficient computation circuit 310, operate for generating filter coefficient data that defines the filter characteristics of the feedforward filter.

Thus, the present embodiment comprises a feedforward filter and computational circuitry for filter coefficient computation that share at least one data processing circuit 330.

Since depending on the mode switch signal, the multifunctional circuits 330 operate either for filtering or for coefficient computation, the circuits 330 are connected to exchange data with the filter circuit 320 in the feedforward filtering mode and the filter coefficient computation circuit 310 in the filter coefficient computation mode.

Figure 4:
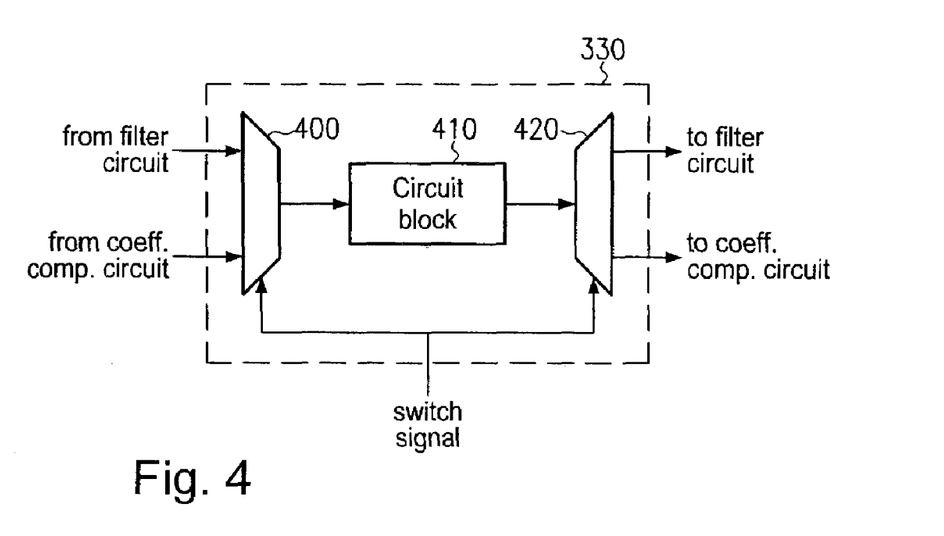
FIG. 4 is a block diagram illustrating multifunctional circuits for use in the decision feedback equalizer of FIG. 3.

Turning now to FIG. 4, the multifunctional data processing unit 330 of the present embodiment is depicted in more detail. As can be seen from the figure, the unit 330 comprises an input multiplexer 400 and an output multiplexer 420 that are each connected to lines to or from the filter circuit 320 and the filter coefficient computation circuit 310. The data processing unit 330 receives the mode switch signal and uses this signal to control the multiplexers 400 and 420 to select either the connection to and from the filter circuit 320 or the connection to and from the filter coefficient computation circuit 310.

In the embodiment of FIG. 4, the multiplexers 400 and 420 are interconnected by means of a circuit block 410. The circuit block 410 may comprise a large set of arithmetic modules that may be used for both feedforward filtering and filter coefficient computation.

It is to be noted that the feedforward filtering part of the decision feedback equalizer according to the embodiment may comprise more than just one data processing unit 330 as shown in FIG. 4. For instance, a high precision fixed point multiplication may be decomposed and the partial product computation may be distributed over a set of small multipliers. In this case, different partial products may be computed in different arithmetic modules that may be arranged much like it is shown in FIG. 4, in order to be shared for both feedforward filtering and filter coefficient computation.

Figure 5:
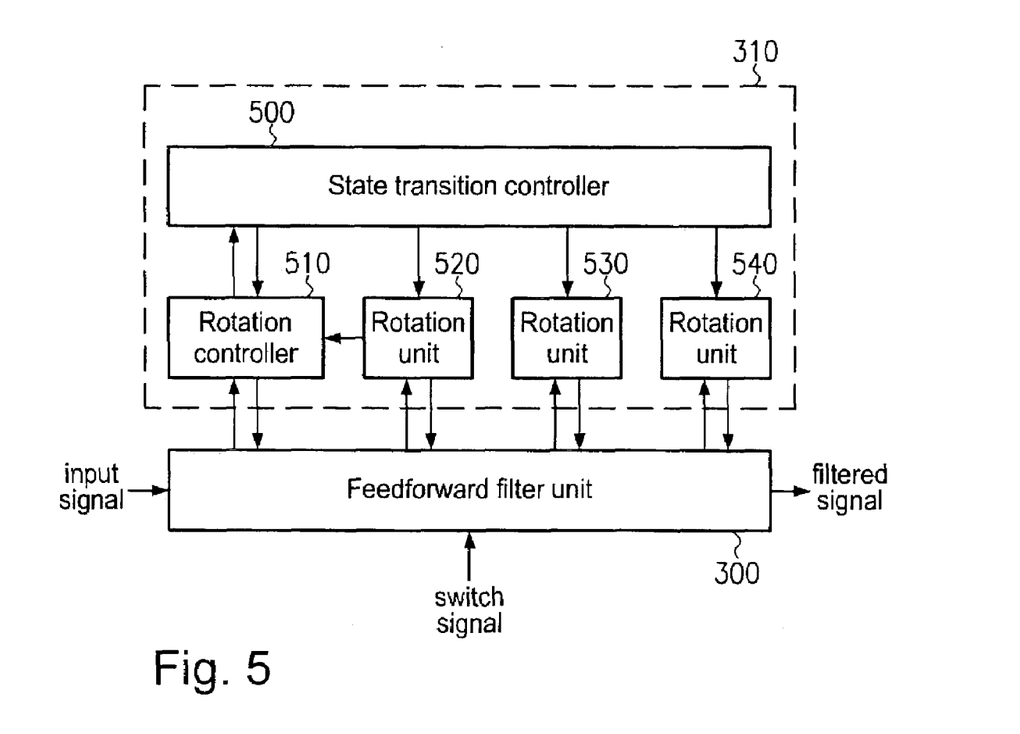
FIG. 5 illustrates the feedforward filtering part of a decision feedback equalizer according to a second embodiment.

Another embodiment of the feedforward filtering part that may be used in the decision feedback equalizer 245 is shown in FIG. 5. As apparent from the figure, a feedforward filter unit 300 is provided that receives the input signal and outputs a filtered representation thereof. As discussed above, the feedforward filter unit 300 shares circuitry with the filter coefficient computation, and receives a mode switch signal to switch the operational mode of this circuitry.

The filter coefficient computation circuit 310 of FIG. 5 is used for controlling the feedforward filter unit 300, and for this purpose it comprises a rotation controller 510 and three rotation units 520, 530, 540. In the present embodiment, the generation of filter coefficient data includes the computation of a Givens rotation.

More specifically, the computation of optimum filter coefficients may be based on a fast Cholesky factorization algorithm which in turn can be split into a series of Givens rotations. The Givens rotation is done by the rotation units 520, 530, 540. For this purpose, the rotation units 520, 530, 540 receive parameters from the rotation controller 510, via feedforward filter unit 300. The rotation controller 510 and the rotation units 520, 530, 540 are controlled by the state transition controller 500 to step through respective control states. The state transition controller 500 may receive input from the rotation controller 510 to determine the correct states.

Figure 6:
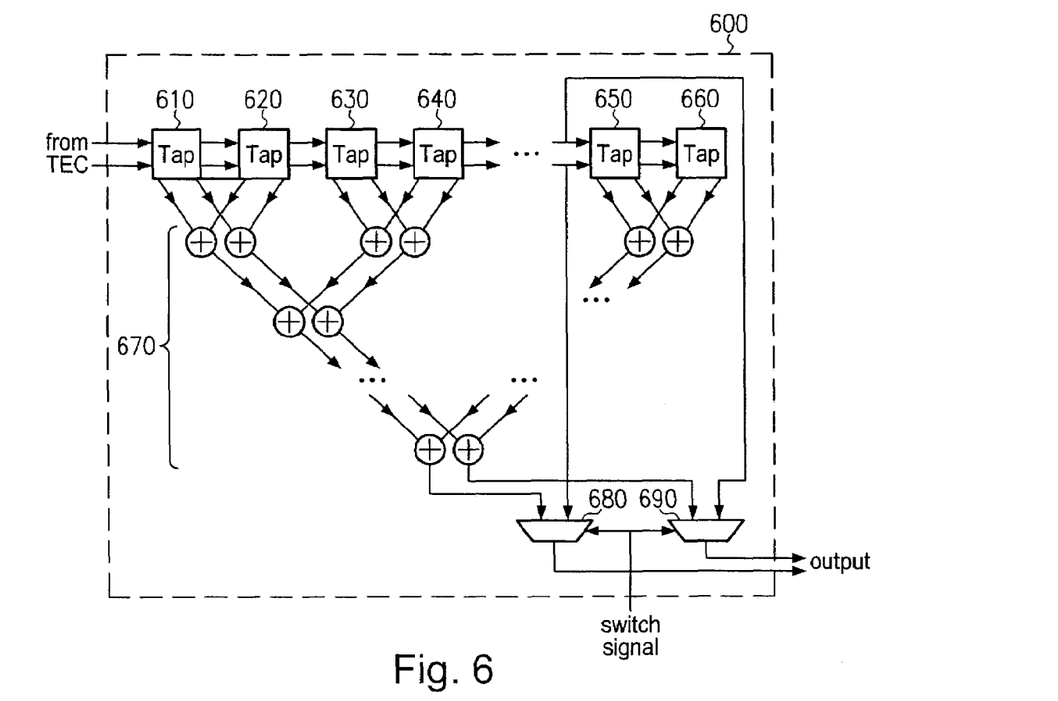
FIG. 6 illustrates the components of the feedforward filter unit that is part of the arrangement shown in FIG. 5.

Turning now to FIG. 6, an embodiment of the feedforward filter unit 300 of FIG. 5 is depicted in more detail. As apparent from the figure, the feedforward filter comprises a number of taps 610–660 that are connected to each other in series. In the present embodiment, twelve taps are used but it is to be mentioned that in another embodiment, more than twelve taps may be provided.

Each tap receives a real and an imaginary input signal and outputs corresponding signals to the next tap. Further, the taps 610–660 generate output data to a network 670 of adders. The adders may separately sum up all of the real and imaginary parts of the output data of all or only some of the taps. The resulting sum is then forwarded to output multiplexers 680, 690 that are controlled by the mode switch signal.

As can be seen from FIG. 6, the output multiplexers 680, 690 further receive input which is branched out of the signal flow through the taps. Thus, the mode switch signal controls the output multiplexers 680, 690 to select either the output of the addition network 670 or the signals branched out of the tap sequence.

Figure 7:
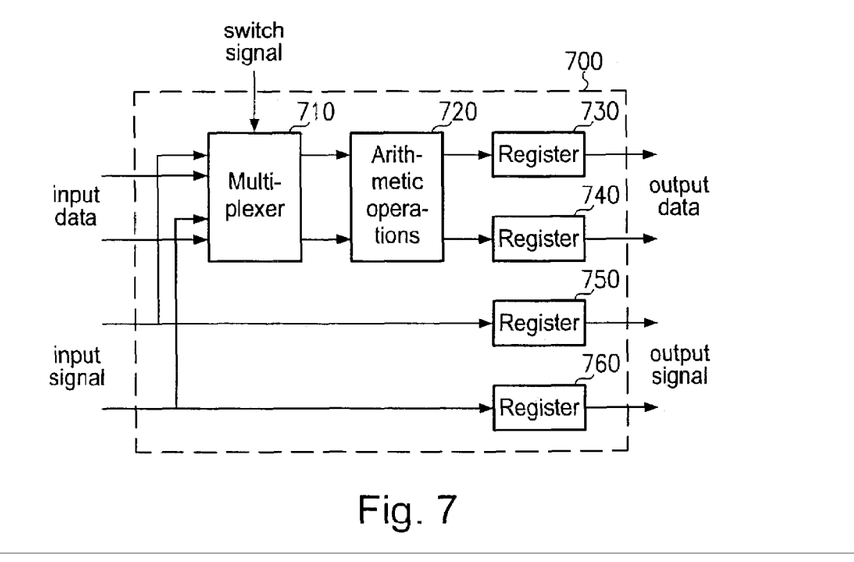
FIG. 7 is a diagram illustrating the components of a tap according to an embodiment, that can be used in the arrangement of FIG. 6.

An embodiment of a tap 610–650 that may be used in the arrangement of FIG. 6 is depicted in FIG. 7. As can be seen from this figure, the input signals are buffered in registers 750, 760 so that the output signal of the tap 700 is actually the buffered input signal. Further, the input signals of the tap 700 are fed to the multiplexers 710 that receive additional input data. The additional input data may differ from tap to tap and may depend from the specific application that is to be performed.

The mode switch signal is used to control the multiplexers 710 to select one of their input line pair, and the selected input is then used to perform the arithmetic operations provided by the data processing unit 720. The result of the arithmetic operations is stored in registers 730, 740.

It is to be noted that there may be different types of taps in the series shown in FIG. 6. These multiple types of taps may differ in the specific implementation of the arithmetic operations 720. Further, the registers may be dropped in some types of taps. It is to be noted that any other implementation of taps may be used in the sequence, including those taps that do not contain shared circuits.

In the present embodiment, at least some of the taps may be of the type shown in FIG. 7. Thus, the feedforward filter may comprise input multiplexers 710 in each of these taps, and the number of input multiplexers 710 may therefore be greater than the number of output multiplexers 680, 690.

Figure 8:
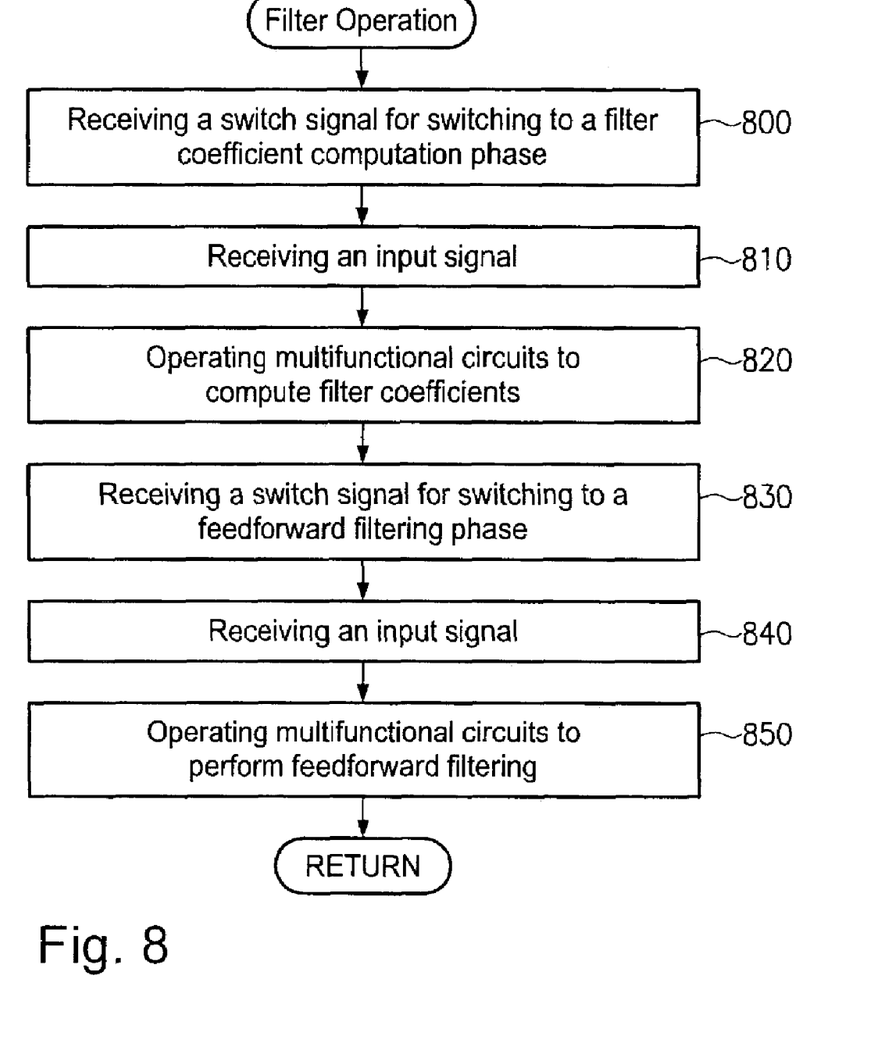
FIG. 8 is a flowchart illustrating the process of operating the feedforward filter part of the decision feedback equalizer according to an embodiment.

Turning now to FIG. 8, an embodiment of the process of operating the feedforward filter is depicted. In step 800, a mode switch signal is received indicating that the data processing unit that comprises the multifunctional circuits is to be switched to a filter coefficient computation phase. Then, an input signal is received in step 810, and the multifunctional circuits are operated in step 820 to compute the filter coefficients.

Once the filter coefficients are computed, an inverse mode switch signal is received in step 830 for switching the feedforward filtering part of the decision feedback equalizer to the filtering phase. Then, an input signal is received in step 840 and filtered in step 850 using the filtering circuit and the multifunctional circuits that now perform feedforwarding filtering functions.

It is thus to be mentioned, that the embodiments specify a sequential automaton that realises a decision feedback equalizer's feedforward filter as well as the filter coefficient computation algorithm. The mode of the multifunctional circuits is sequentially toggled using the mode switch signal so that the feedforwarding filtering function and the filter coefficient computation function are sequentially performed. This sequence may be that of the steps shown in the embodiment of FIG. 8 but it is to be mentioned that in other embodiments, the sequence may be different therefrom.

As apparent from the above embodiments, a decision feedback equalization technique is provided where circuitry is shared for performing forward filter functions and filter coefficient computation functions. This advantageously allows for reducing the gate count without deteriorating the overall system performance. By using the same circuitry for two or more functions, the necessary chip area is reduced, allowing for even more scaling down the integrated circuit chip and thus also reducing the power consumption.

Moreover, it is to be mentioned that the present embodiments apply the described decision feedback equalization technique in the baseband processor 200 of a WLAN receiver that performs the signal synchronization. In other embodiments, the decision feedback equalization technique described above may be used in other data communications systems and other hardware environments.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention. In addition, those areas in which it is believed that those of ordinary skill in the art are familiar, have not been described herein in order to not unnecessarily obscure the invention described herein. Accordingly, it is to be understood that the invention is not to be limited by the specific illustrative embodiments, but only by the scope of the appended claims.

What is claimed is:

1. A data communications receiver having a decision feedback equalizer comprising:
    a feedforward filter connected to receive an input data signal and output a filtered representation thereof, said feedforward filter having a filter characteristic depending on filter coefficient data; and
    a filter coefficient computation unit for generating said filter coefficient data and outputting the generated data to said feedforward filter;
    wherein said decision feedback equalizer further comprises at least one data processing circuit operable in at least two operational modes and connected to receive a mode switch signal for switching the operational mode, said data processing circuit being arranged for performing a feedforward filter function of said feedforward filter in one of said at least two operational modes and a filter coefficient computation function of said filter coefficient computation unit in another one of said at least two operational modes.

2. The data communications receiver of claim 1, wherein said data processing circuit comprises:
    at least one input multiplexer connected to receive at least two input signals and further connected to receive said mode switch signal, said input multiplexer being adapted to select one of said input signals dependent on said mode switch signal.

3. The data communications receiver of claim 2, wherein said feedforward filter comprises a plurality of taps, and said at least one input multiplexer is located within one of said taps.

4. The data communications receiver of claim 1, wherein said data processing circuit comprises:
    at least one output multiplexer connected to receive an input signal and said mode switch signal, said output multiplexer being adapted to select one of at least two output lines dependent on said mode switch signal and pass said input signal to the selected output line.

5. The data communications receiver of claim 4, wherein said feedforward filter comprises a plurality of taps and further comprises circuitry for processing output signals of said taps, said at least one output multiplexer being connected to receive an output of said circuitry as said input signal.

6. The data communications receiver of claim 1, wherein said data processing circuit comprises:
    at least one input multiplexer connected to at least two input lines; and
    at least one output multiplexer connected to at least two output lines,
    wherein said input and output multiplexers are connected to receive said mode switch signal and select one of said input or output lines, respectively, dependent on said mode switch signal, and
    wherein the number of input multiplexers is greater than the number of output multiplexers.

7. The data communications receiver of claim 1, wherein said data processing circuit comprises a network of arithmetic modules for performing said functions.

8. The data communications receiver of claim 7, wherein said network of arithmetic modules is arranged for performing a high precision fixed point multiplication, and said arithmetic modules, are adapted to each compute a partial product.

9. The data communications receiver of claim 1, wherein said feedforward filter comprises a plurality of taps connected in series.

10. The data communications receiver of claim 9, wherein said data processing circuit is part of at least one of said taps when performing said feedforward filter function.

11. The data communications receiver of claim 10, wherein said data processing circuit comprises at least one register for storing a result of said feedforward filter function.

12. The data communications receiver of claim 9, wherein said plurality of taps comprises taps of different types.

13. The data communications receiver of claim 9, wherein said feedforward filter further comprises an adder network receiving output data of at least a part of said taps for summing up said data.

14. The data communications receiver of claim 9, wherein the number of taps is at least twelve.

15. The data communications receiver of claim 1, wherein said feedforward filter comprises a plurality of taps, and said data processing circuit comprises at least two sub-circuits working together when performing said feedforward filter function, a first one of said sub-circuits being part of one of said taps and a second one of said sub-circuits not being part of any one of said taps.

16. The data communications receiver of claim 15, wherein said data processing circuit further comprises a third sub-circuit working together with said second sub-circuit when performing said feedforward filter function, said third sub-circuit being part of another one of said taps.

17. The data communications receiver of claim 16, wherein said first and third sub-circuits are different in construction.

18. The data communications receiver of claim 1, further comprising a timing error correction unit connected to said decision feedback equalizer for providing said input data signal.

19. The data communications receiver of claim 1, further comprising a baseband processor, wherein said decision feedback equalizer is comprised in said baseband processor.

20. The data communications receiver of claim 1, further comprising a signal synchronization unit, wherein said decision feedback equalizer is comprised in said signal synchronization unit.

21. A WLAN (Wireless Local Area Network) receiver having a decision feedback equalizer comprising:
   a feedforward filter connected to receive an input data signal and output a filtered representation thereof, said feedforward filter having a filter characteristic depending on filter coefficient data; and
   a filter coefficient computation unit for generating said filter coefficient data and outputting the generated data to said feedforward filter;
   wherein said decision feedback equalizer further comprises at least one data processing circuit operable in at least two operational modes and connected to receive a mode switch signal for switching the operational mode, said data processing circuit being arranged for performing a feedforward filter function of said feedforward filter in one of said at least two operational modes and a filter coefficient computation function of said filter coefficient computation unit in another one of said at least two operational modes.

22. An integrated circuit chip having decision feedback equalization circuitry comprising:
   a feedforward filter circuit connected to receive an input data signal and output a filtered representation thereof, said feedforward filter circuit having a filter characteristic depending on filter coefficient data; and
   a filter coefficient computation circuit for generating said filter coefficient data and outputting the generated data to said feedforward filter circuit;
   wherein said decision feedback equalization circuitry further comprises at least one data processing circuit operable in at least two operational modes and connected to receive a mode switch signal for switching the operational mode, said data processing circuit being arranged for performing a feedforward filter function of said feedforward filter circuit in one of said at least two operational modes and a filter coefficient computation function of said filter coefficient computation circuit in another one of said at least two operational modes.

23. A method of operating a decision feedback equalizer in a data communications receiver, the method comprising:
   generating filter coefficient data;
   receiving an input data signal;
   filtering said input data signal in a feedforward filter of said decision feedback equalizer using said filter coefficient data; and
   outputting a filtered representation of said input data signal,
   wherein generating said filter coefficient data comprises receiving a mode switch signal for switching an operational mode of at least one data processing circuit of said decision feedback equalizer to a filter coefficient computation mode and operating said data processing circuit to perform a filter coefficient computation function, and
   wherein filtering said input data signal comprises receiving a mode switch signal for switching said operational mode of said data processing circuit to a feedforward filter mode and operating said data processing circuit to perform a feedforward filter function.

24. The method of claim 23, wherein the steps of operating said data processing circuit further comprise:
   selecting one of at least two input signals of at least one input multiplexer of said data processing circuit dependent on said mode switch signal.

25. The method of claim 23, wherein the steps of operating said data processing circuit further comprise:
   selecting one of at least two output lines of at least one output multiplexer of said data processing circuit dependent on said mode switch signal.

26. The method of claim 23, wherein the steps of operating said data processing circuit further comprise:
   selecting one of at least two input lines of at least one input multiplexer of said data processing circuit dependent on said mode switch signal; and
   selecting one of at least two output lines of at least one output multiplexer of said data processing circuit dependent on said mode switch signal,
   wherein the number of input multiplexers is greater than the number of output multiplexers.

27. The method of claim 23, wherein performing said functions comprises operating a network of arithmetic modules of said data processing circuit.

28. The method of claim 27, further comprising:
   performing a high precision fixed point multiplication using said network of arithmetic modules, by operating said arithmetic modules to compute partial products.

29. The method of claim 23, wherein filtering said input data signal comprises operating a plurality of taps of said feedforward filter.

30. The method of claim 29, wherein said data processing circuit is part of at least one of said taps when performing said feedforward filter function.

31. The method of claim 30, further comprising:
   storing a result of said feedforward filter function in at least one register of said data processing circuit.

32. The method of claim 29, wherein said plurality of taps comprises taps of different types.

33. The method of claim 29, wherein filtering said input data signal further comprises operating an adder network receiving output data of at least a part of said taps for summing up said data.

34. The method of claim 29, wherein the number of taps is at least twelve.

35. The method of claim 23, wherein said feedforward filter comprises a plurality of taps and said data processing circuit comprises at least two sub-circuits, and wherein performing said feedforward filter function comprises:
   operating a first one of said sub-circuits, said first sub-circuit being part of one of said taps; and
   operating a second one of said sub-circuits, said second sub-circuit not being part of any one of said taps.

36. The method of claim 35, wherein performing said feedforward filter function further comprises:
   operating a third sub-circuit to work together with said second sub-circuit, said third sub-circuit being part of another one of said taps.

37. The method of claim 36, wherein said first and third sub-circuits are different in construction.

38. The method of claim 23, wherein said data communications receiver further comprises a timing error correction unit, and said input data signal is received by said decision feedback equalizer from said timing error correction unit.

39. The method of claim 23, wherein said decision feedback equalizer is comprised in a baseband processor of said data communications receiver.

40. The method of claim 23, wherein said decision feedback equalizer is comprised in a signal synchronization unit of said data communications receiver.

* * * * *